(12) United States Patent
Zhao et al.

(10) Patent No.: US 10,705,124 B2
(45) Date of Patent: Jul. 7, 2020

(54) METHOD, A NON-TRANSITORY STORAGE MEDIUM AND A BATTERY GRADING APPARATUS FOR AUTOMATICALLY GRADING A LITHIUM-ION BATTERY

(71) Applicant: SHENZHEN HYNN TECHNOLOGIES CO., LTD., Shenzhen (CN)

(72) Inventors: Shaohua Zhao, Shenzhen (CN); Shoumo Wang, Shenzhen (CN)

(73) Assignee: SHENZHEN HYNN TECHNOLOGIES CO., LTD., Shenzhen (CN)

( * ) Notice: Subject to any disclaimer, the term of this patent is extended or adjusted under 35 U.S.C. 154(b) by 110 days.

(21) Appl. No.: 15/879,805

(22) Filed: Jan. 25, 2018

(65) Prior Publication Data
US 2019/0128931 A1 May 2, 2019

(30) Foreign Application Priority Data
Oct. 31, 2017 (CN) .......................... 2017 1 1044275

(51) Int. Cl.
*G01R 19/165* (2006.01)
*H01M 10/0525* (2010.01)
(Continued)

(52) U.S. Cl.
CPC ... *G01R 19/16542* (2013.01); *G01R 31/3648* (2013.01); *H01M 10/0525* (2013.01);
(Continued)

(58) Field of Classification Search
CPC ......... G01R 19/16542; G01R 31/3648; H01M 10/0525
See application file for complete search history.

(56) References Cited

U.S. PATENT DOCUMENTS 6,396,245 B1 * 5/2002 Jeong .................... H02J 7/0031
                                                              320/132
7,777,446 B2 * 8/2010 Ueda ..................... H02J 7/1438
                                                              320/104
(Continued)

OTHER PUBLICATIONS

Wang et al., "Multi-parameter battery state estimator based on the adaptive and direct solution of the governing differential equations" Journal of power sciences 196 (2011) 8735-8741 (Year: 2011).*

*Primary Examiner* — Patrick Assouad
*Assistant Examiner* — Feba Pothen
(74) *Attorney, Agent, or Firm* — Nixon & Vanderhye PC (57) ABSTRACT

This application has disclosed a method, a non-transitory storage medium and a battery grading apparatus for automatically grading a lithium-ion battery. The method comprises: 1) preprocessing a cell of the lithium-ion battery with formation and grading, obtaining measured current and/or voltage data of charging/discharging during the process of formation and grading, and preprocessing the obtained current and/or voltage data; 2) plotting the preprocessed data into a measurement curve, matching it with a pre-stored standard reference curve for charging and discharging, and calculating a linear distance, a square of the linear distance and a first order differential distance between the measurement curve and the standard reference curve; calculating weighted distances and weighted summation distances for the calculated linear distance, square of the linear distance and first order differential distance respectively; and comparing and matching the weighted summation distances with a preset threshold range for each grading level and outputting a matching outcome.

9 Claims, 6 Drawing Sheets

Preprocessing a cell of the lithium-ion battery with formation and grading, obtaining measured current and/or voltage data of charging/ discharging during the process of formation and grading, and preprocessing the obtained current and/or voltage data — S100

Plotting the preprocessed data into a measurement curve, matching it with a stored standard reference curve for charging and discharging, and calculating a linear distance, a square of linear distance and a first order differential distance between the measurement curve and the standard reference curve — S200

Calculating weighted distances and weighted summation distances for the calculated linear distance, the square of linear distance and the first order differential distance respectively, comparing and matching the weighted summation distances with a preset threshold range for each grading level, and outputting a matching outcome — S300

(51) Int. Cl.
*G01R 31/36* (2020.01)
*H01M 10/48* (2006.01)
*H01M 10/42* (2006.01)
*H01M 10/44* (2006.01)

(52) U.S. Cl.
CPC ..... *H01M 10/4285* (2013.01); *H01M 10/446* (2013.01); *H01M 10/482* (2013.01); *H01M 2220/20* (2013.01)

(56) References Cited

U.S. PATENT DOCUMENTS

| | | | |
|---|---|---|---|
| 8,880,367 B1* | 11/2014 | Yang | G01R 19/16542 702/63 |
| 2011/0234232 A1* | 9/2011 | Ro | B07C 5/344 324/433 |
| 2013/0154574 A1* | 6/2013 | Nomoto | H01M 10/48 320/148 |
| 2014/0214349 A1* | 7/2014 | Dong | G01R 31/392 702/63 |
| 2016/0245876 A1* | 8/2016 | Vinassa | B60L 58/16 |

* cited by examiner

METHOD, A NON-TRANSITORY STORAGE MEDIUM AND A BATTERY GRADING APPARATUS FOR AUTOMATICALLY GRADING A LITHIUM-ION BATTERY

CROSS REFERENCE TO RELATED APPLICATION

This application claims priority to Chinese Patent Applications No. 201711044275.5 filed on Oct. 31, 2017, which is incorporated herein by reference.

FIELD OF THE DISCLOSURE

Certain example embodiments disclosed herein relate generally to a power battery pack, and more specifically, certain example embodiments disclosed herein relate to a method, a non-transitory storage medium and a battery grading apparatus for automatically grading a lithium-ion battery.

BACKGROUND

The consistency among lithium-ion battery cells is critical to a battery pack. Due to the difference in characteristics like voltage, internal resistance, capacity, etc. among lithium-ion battery cells of the same model and specification, when a battery pack including multiple battery cells is utilized in an electric vehicle, it would not be able to hold the original level of performance of each single cell. As such, it will seriously affect the application of the battery pack in electric vehicles. Therefore, the consistency of characteristics among battery cells becomes a critical factor in the lifecycle of a battery pack, and lithium-ion battery grading is one of the most important processes in automatic manufacture of battery cells. Lithium-ion battery grading is to categorize batteries in accordance with certain criteria such that batteries of similar performance are grouped together.

Most existing techniques use a battery charging/discharging curve to grade lithium-ion batteries. However, it is hard to accurately grade batteries by such a method. Some techniques propose a grading method based on the length of a horizontal segment of a battery charging/discharging curve. However, the length of a horizontal segment may not be able to thoroughly evaluate the characteristics of a battery. In other techniques, a discretely measurement curve of a battery is first fitted with a polynomial, and then the battery is graded by comparing and filtering the coefficients of the polynomial. However, precise curve fitting requires a high order polynomial, and hence the fitting requires very complicated calculations. Moreover, when grading by polynomial coefficients, any nuance in a high order coefficient may cause a large difference in the curve. As a result, it is hard to control the grading precision.

In view of the above, existing techniques still need improvement and further development.

SUMMARY

In light of the limitations of existing techniques mentioned above, certain example embodiments described herein provide a method, a non-transitory storage medium and a battery grading apparatus for automatically grading a lithium-ion battery, in order to overcome the shortcomings or limitations of existing techniques for lithium-ion battery grading.

Some example embodiments are directed to a method for automatically grading a lithium-ion battery by a battery grading apparatus. The method comprises the following steps:

Step A: preprocessing a cell of the lithium-ion battery with formation and grading, obtaining measured current and/or voltage data of charging/discharging during the process of formation and grading, and preprocessing the obtained current and/or voltage data.

Step B: plotting the preprocessed data into a measurement curve, matching it with a stored standard reference curve for charging and discharging, and calculating a linear distance, a square of the linear distance and a first order differential distance between the measurement curve and the standard reference curve.

Step C: calculating a weighted distance and a weighted summation distance for each of the calculated linear distance, the square of the linear distance and the first order differential distance, comparing and matching the weighted summation distances with a preset threshold range for each grading level and outputting a matching outcome.

In accordance with the matching outcome of the lithium-ion battery, the battery may be categorized into a specific grading level. Based on the grading results of plural batteries, batteries of similar parameters and performance may be grouped together to form a power battery pack. In an example embodiments, lithium-ion batteries categorized into the same grading level may be grouped together to form a power battery pack.

In an example embodiment, Step A further comprises smoothing, filtering and interpolating the measure current and/or voltage data.

Figure 6:
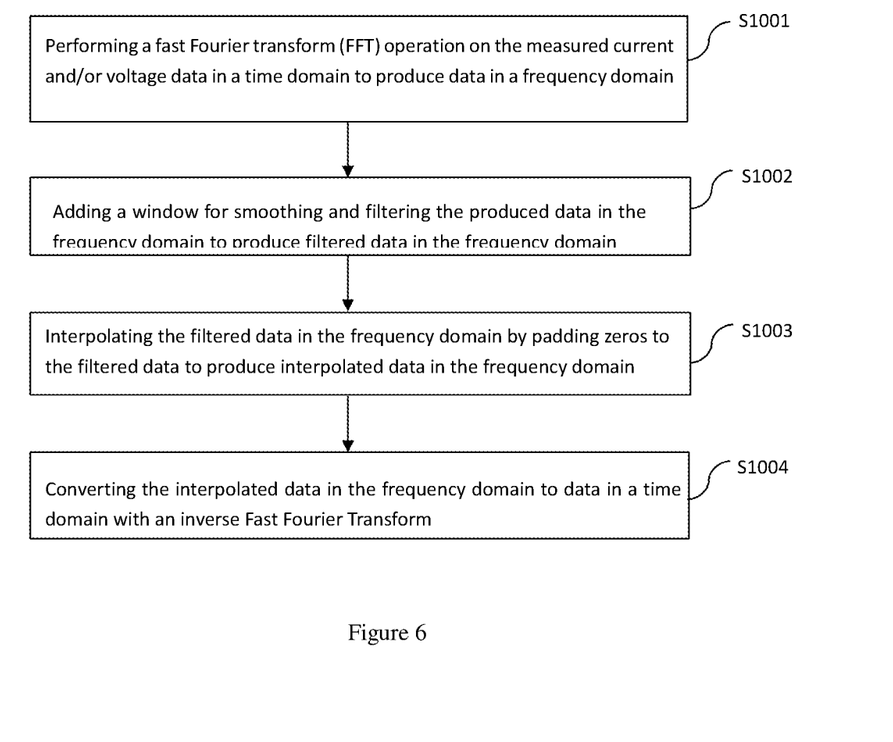
FIG. 6 shows a non-limiting, exemplary flowchart of an example method for smoothing, filtering and interpolating of measured current and/or voltage data.

In another example embodiment, as shown in FIG. 6, the smoothing, filtering and interpolating of the measured current and/or voltage data comprises:

1) Step S1001: Performing a fast Fourier transform (FFT) operation on the measured current and/or voltage data in a time domain to produce data in a frequency domain;

2) Step S1002: Adding a window for smoothing and filtering the produced data in the frequency domain to produce filtered data in the frequency domain;

3) Step S1003: Interpolating the filtered data in the frequency domain by padding zeros to the filtered data to produce interpolated data in the frequency domain; and 4) Step S1004: Converting the interpolated data in the frequency domain to data in a time domain with an inverse Fast Fourier Transform.

It is envisioned that the method in one example embodiment comprises the following steps before the Step A:

Step S: Pre-storing the standard reference curve into the battery grading apparatus, to be matched with the measurement curve.

In some example embodiments, the Step B comprises following steps:

Step B1: obtaining the measured current and/or voltage data after preprocessing, and calling a curve plotting program to plot the obtained data into the measurement curve;

Step B2: calling out the pre-stored standard reference curve, and then comparing and analyzing it with the measurement curve;

Step B3: calculating the linear distance, the square of the linear distance and the first order differential distance between the measurement curve and the standard reference curve.

Figure 7:
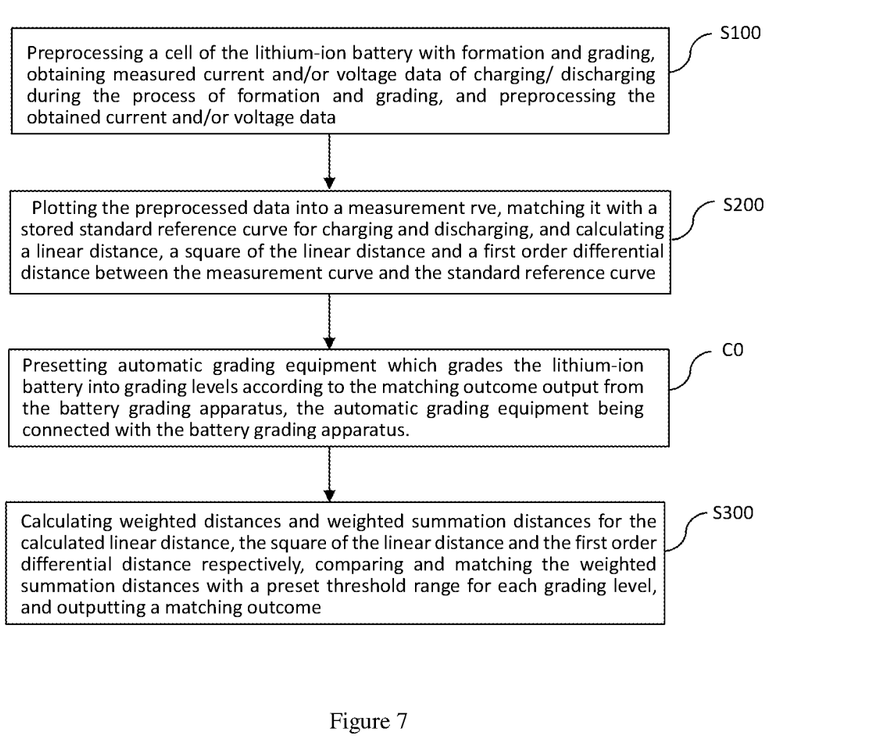
FIG. 7 shows a non-limiting, exemplary flowchart of an example method for automatically grading a lithium-ion battery.

In other example embodiments, the method comprises the following step before the Step C (as shown in FIG. 7):

Step C0: presetting automatic grading equipment which grades the lithium-ion battery into grading levels according to the matching outcome output from the battery grading apparatus. The automatic grading equipment is connected with the battery grading apparatus.

In yet another example embodiment, the Step C comprises following steps:

Step C1: estimating a start point of the measurement curve relevant to the standard reference curve;

Step C2: dividing the measurement curve into several segments, weighting each segment with a unique weighting factor, and calculating the weighted summation of the linear distance, the weighted summation of the square of the linear distance and the weighted summation of the first order differential distance;

Step C3: comparing and matching the weighted summation distances with a preset threshold range for each grading level and outputting a matching outcome to automatic grading equipment.

Step C4: receiving the matching outcome from the battery grading apparatus and grading the lithium-ion battery into at least one grading level by the automatic grading equipment to accomplish lithium-ion battery grading.

In certain example embodiments, the step C3 also comprises following steps:

Step C31: presetting the battery grading apparatus with several grade levels and setting a threshold range for each of the grade levels.

Step C32: comparing and matching a threshold range for one of the grade levels with the weighted summation distance of the linear distance, the weighted summation of the square of the linear distance and the weighted summation of the first order differential distance, wherein if any of the weighted summation distances is outside of a preset threshold range of a grading level, the lithium-ion battery will be graded to an unqualified level and the matching outcome is output to the automatic grading equipment.

Step C33: in response to a determination that the lithium-ion battery does not belong to the unqualified level, weighting and summing the weighted summation distance of the linear distance, the weighted summation distance of the square of the linear distance and the weighted summation distance of the first order differential distance respectively, comparing and matching the weighted summation distances with a threshold range of each grading level one by one, until finding out an appropriate grading level, and outputting the matching outcome to the automatic grading equipment.

Some example embodiments are directed to a non-transitory computer-readable storage medium, having computer-executable instructions embodied thereon. Upon executed by one or more processors of an electronic device, the computer-executable instructions cause the one or more processors to perform any above method for automatically grading a lithium-ion battery.

Some example embodiments are directed to a battery grading apparatus comprising a programmable device and a memory which connects to the programmable device and is used to store multiple instructions. The programmable device is used to call instructions in memory to execute any above method for automatically grading a lithium-ion battery.

The beneficial effects of the above described example embodiments include:

The method for automatically grading a lithium-ion battery works by comparing the preset grading level with weighted summation distances of a linear distance, a square of the linear distance and a first order differential distance between a lithium-ion battery charging/discharging measurement curve and a standard reference curve. In this way, lithium-ion batteries are categorized into different grading levels in accordance with their characteristics and performance, and hence batteries of similar parameters (e.g., at the same grading level) may be grouped into a power battery pack.

Therefore, the above-disclosed method for automatically grading the lithium-ion battery effectively ensures the consistency of battery parameters and increases the cyclic life of a power battery pack, by virtue of its simple calculation and high precision in lithium-ion battery grading.

BRIEF DESCRIPTION OF THE DRAWINGS

The accompanying drawings facilitate an understanding of the various preferred embodiments of this invention. In such drawings.

DETAILED DESCRIPTION OF EXEMPLARY EMBODIMENTS

In order to be more clear and definite for the intention purpose, technical proposal and advantages of this invention, the following embodiments with figures will further elaborate the invention. In the following description, for purpose of explanation, numerous specific details are set forth to provide a thorough understanding of the exemplary embodiments. It will be evident, however, to a person skilled in the art that the exemplary embodiments may be practiced without these specific details.

Figure 1:
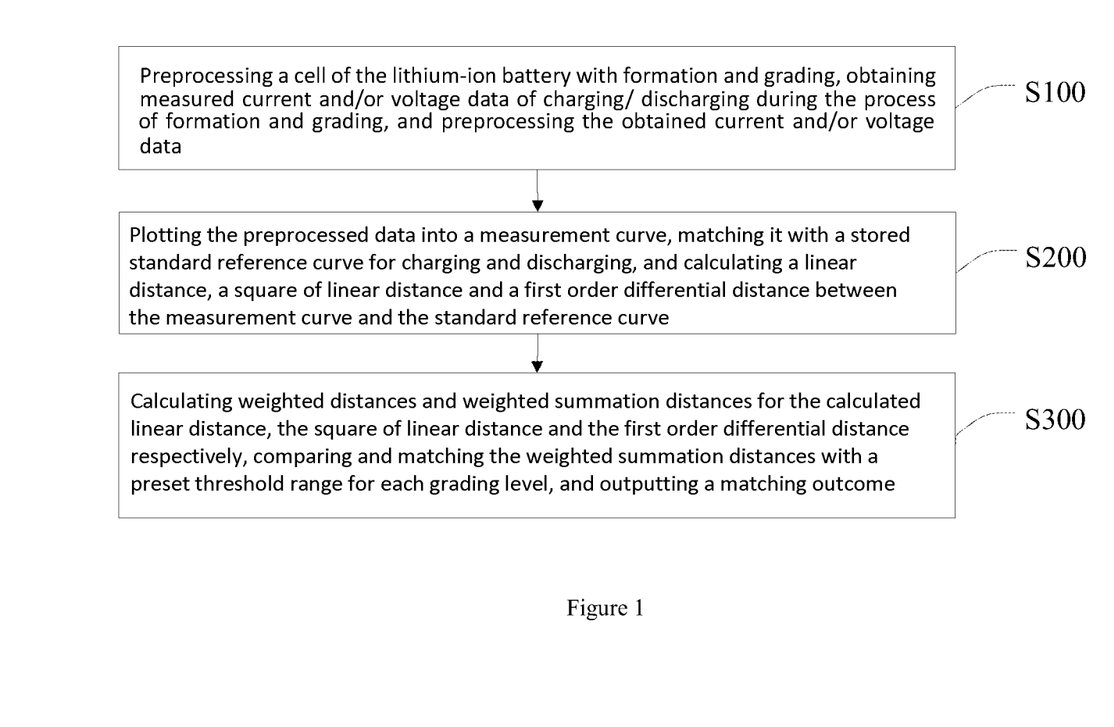
FIG. 1 shows a non-limiting, exemplary flowchart of an example method for automatically grading a lithium-ion battery.

FIG. 1 shows a non-limiting, exemplary flowchart of an example method for automatically grading a lithium-ion battery. The example method for automatically grading a lithium-ion battery comprises the following steps:

Step S100: preprocessing a cell of the lithium-ion battery with formation and grading, obtaining measured current and/or voltage data of charging/discharging during the process of formation and grading, and preprocessing the obtained current and/or voltage data.

The battery charging/discharging curve, as a key parameter reflecting the internal characteristics of a battery, such as its capacity property, internal resistance, charging/discharging plate and degree of polarization, is an important indicator to show electrode materials and can sufficiently reflect battery internal properties. For example, the voltage rising rate at the beginning of charging can reflect the diversity of diffusion velocities and reaction velocities for lithium-ion battery internal protons. While the dropping rate at the end of discharging curve can reflect a degree of polarization. Therefore, utilizing battery charging/discharging curve to grade batteries can significantly improve the pairing accuracy hence the consistency of the groups.

In an example embodiment, a cell of the lithium-ion battery is preprocessed with formation and grading, then the battery grading apparatus obtains measured current and/or voltage data of charging/discharging during the process of formation and grading, and preprocessing the obtained current and/or voltage data. Preferably, the data preprocessing in Step A comprises processes of smoothing, filtering and interpolation of the measured current and/or voltage data, as shown in Step S100' of FIG. 5.

Figure 5:
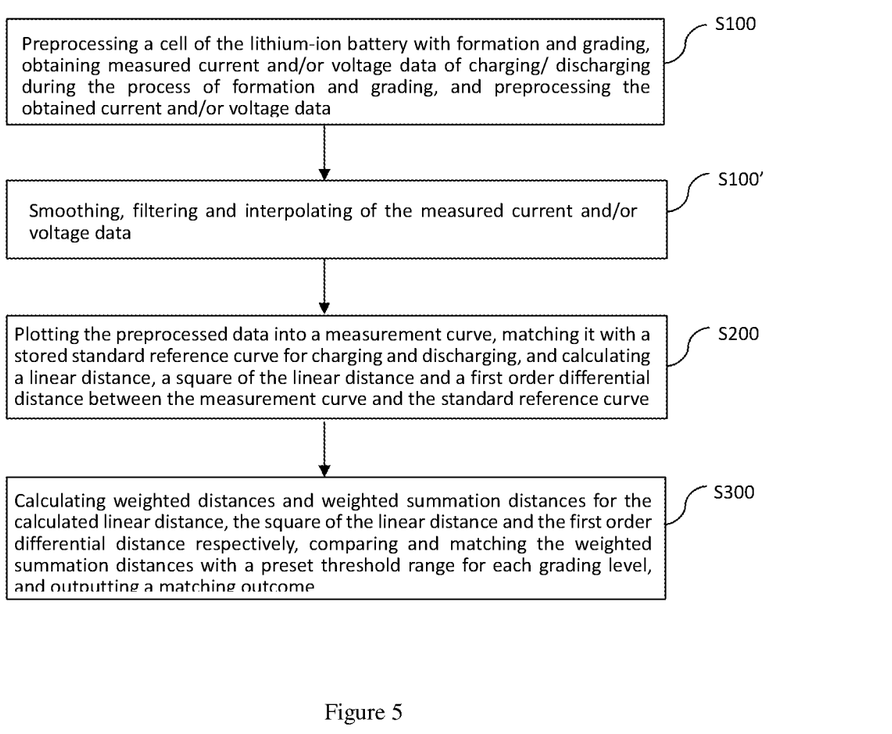
FIG. 5 shows a non-limiting, exemplary flowchart of an example method for automatically grading a lithium-ion battery.

In some example embodiments, the smoothing, filtering and interpolation of the measured current and/or voltage data comprise following steps:

Assuming there are M sampling point in time domain $\{r_m\}$, m=0, 2, ... M−1

Converting the Time Domain Signal to Frequency Domain Signal with Fast Fourier Transform $$\{y_k\} = \frac{1}{M}\sum_{m=0}^{M-1} r_m e^{-j\frac{2\pi k}{M}m}$$

where, k is the index of the normalized discrete frequency.

Adding a Raised Cosine (RC) Window for Smoothing and Filtering $$\tilde{y}_k = y_k \cdot H(f)$$

where $$H(f) = \begin{cases} T, & 0 \leq |f| \leq \frac{1-\beta}{2T} \\ \frac{T}{2}\left\{1 + \cos\left[\frac{\pi T}{\beta}\left(|f| - \frac{1-\beta}{2T}\right)\right]\right\}, & \frac{1-\beta}{2T} \leq |f| \leq \frac{1+\beta}{2T} \\ 0 & |f| > \frac{1+\beta}{2T} \end{cases}$$

β is the stop frequency.

It should be understood, the embodiment of adding a raised cosine window for smoothing and filtering here is to explain the technical proposal of this invention, but not restrict to the invention. Adding other windows for smoothing and filtering should also be protected within the invention.

To Up-Sample the Measured Current and/or Voltage Data to the Same Sampling Rate with Reference Curve, Interpolate the Filtered Data by Zeros Padding with Factor of M $$\hat{y}_n = \begin{cases} \tilde{y}_n, & n = 0, 1, \ldots, M-1 \\ 0, & n = M, \ldots, N-1 \end{cases}$$

Converting the Processed Frequency Domain Data to Time Domain with Inverse Fast Fourier Transform $$\{\hat{r}_n\} = \frac{1}{N}\sum_{l=0}^{N-1} \hat{y}_l e^{j\frac{2\pi n}{N}l}.$$

The above steps achieve the preprocessing of the measured current and/or voltage data and up-sampling it to the same sampling rate with the standard reference curve.

Step S200: plotting the preprocessed data into a measurement curve, matching it with a stored standard reference curve for charging and discharging, and calculating a linear distance, a square of the linear distance and a first order differential distance between the measurement curve and the standard reference curve.

Preferably, the Step S200 comprises following steps:

Step S201: obtaining measured current and/or voltage data after preprocessing by the battery grading apparatus, then calling a curve plotting program to plot the data into the measurement curve;

Step S202: Calling out the pre-stored standard reference curve by the battery grading apparatus, then comparing and analyzing it with the measurement curve;

Step S203: calculating the linear distance, the square of the linear distance and the first order differential distance between the measurement curve and standard reference curve.

Figure 2:
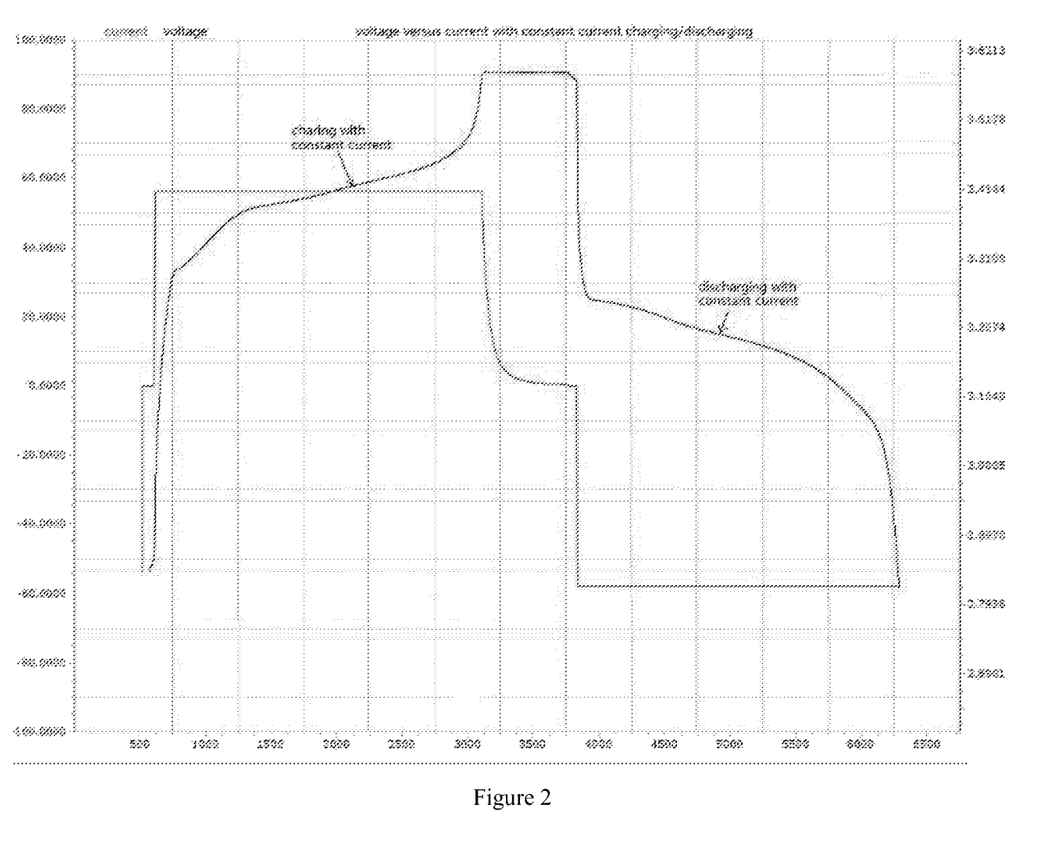
FIG. 2 shows a non-limiting, exemplary standard charging/discharging curve of an example method for automatically grading a lithium-ion battery.

In an example embodiment, the standard reference curve is pre-stored into the battery grading apparatus, to match with the measurement curve. FIG. 2 shows a non-limiting, exemplary standard charging/discharging curve of an example method for automatically grading a lithium-ion battery. The standard charging/discharging curve comprises measured results from battery samples. Firstly, the battery grading apparatus obtains the measured current and/or voltage data after preprocessing, then calls a curve plotting program to plot the data into the measurement curve. Secondly, the battery grading apparatus calls out the pre-stored standard reference curve, then compares and analyzes it with the measurement curve. Finally, calculating the linear distance, the square of the linear distance and the first order differential distance between the measurement curve and standard reference curve. Concretely, the detailed algorithms for calculating the linear distance and the first order differential distance are described as per below:

1. Calculating the Linear Normalized Distance:

$$e_0(n) = (\hat{r}_n - x_n)/x_n, \, n=0, \ldots, N-1$$

where $\hat{r}_n$ is the measurement curve, $x_n$ is the standard reference curve, and $e_0(n)$ is the linear normalized distance.

2. Calculating the First Order Differential Distance:

$$\hat{d}(n) = \hat{r}_n - \hat{r}_{n-1}, \, n=1, \ldots, N-1;$$

$$d(n) = x_n - x_{n-1}, \, n=1, \ldots, N-1;$$

$$e_1(n) = \hat{d}(n) - d(n), \, n=1, \ldots, N-1.$$

where $\hat{d}(n)$ is the first order differential of measured curve, $\hat{r}_n$ is the measurement curve, $d(n)$ is the first order differential of standard reference curve, $x_n$ is the standard reference curve, and $e_1(n)$ is the first order differential distance.

Step S300: calculating a weighted distance and a weighted summation distance for each of the calculated linear distance, the square of the linear distance and the first order differential distance, comparing and matching the weighted summation distances with a preset threshold range for each grading level and outputting a matching outcome.

In accordance with the matching outcome of the lithium-ion battery, the battery may be categorized into a specific grading level. Based on the grading results of plural batteries, batteries of similar parameters and performance may be grouped together to form a power battery pack. In an example embodiments, lithium-ion batteries categorized into the same grading level may be grouped together to form a power battery pack.

In certain example embodiments, the above Step S300 comprises following steps:

Step S301: estimating the start point of the measurement curve relevant to the standard reference curve;

Step S302: dividing the measurement curve into several segments, and weight each segment with a unique weighting factor, Calculating weighted summation of the linear distance, weighted summation of the square of the linear distance and weighted summation of the first order differential distance;

Step S303: comparing and matching the weighted summation distances with a preset threshold range for each grading level and outputting a matching outcome to automatic grading equipment.

Step S304: receiving the matching outcome from the battery grading apparatus and grading the lithium-ion battery into at least one grading level to accomplish lithium-ion battery grading, by the automatic grading equipment.

In an example embodiment, due to slight differences in the battery state of charge (SOC) of the cell when charging/discharging started, the start point relevant to the reference curve of the measurement curve shall be determined first. A method by finding the minimum distance in a slide window is proposed in this example embodiment. The detailed steps are described as per below:

$$e_{std} = \infty$$
$$p_{std} = 0$$
$$\text{for } w=0:1:W$$

$$\varepsilon = \left| \sum_{n=w}^{N+w-1} (\hat{r}_n - x_n) \right|$$

$$\text{if } \varepsilon < e_{std}$$
$$e_{std} = \varepsilon$$
$$p_{std} = w$$
$$\text{end}$$
$$\text{end}$$

After estimated the starting point of the measurement curve, dividing the curve into P segments, then weight every segment with a unique weighting factor. Calculating the weighted distance and the weighted summation distance according to the weighting factor. The detailed steps are described as per below:

$$\varepsilon_0 = \frac{1}{N} \sum_{p=0}^{P} w_p \sum_{n=p_{std}+N_p}^{p_{std}+N_{p+1}-1} e_0(n);$$

$$\varepsilon_1 = \frac{1}{N} \sum_{p=0}^{P} w_p \sum_{n=p_{std}+N_p}^{p_{std}+N_{p+1}-1} |e_0(n)|^2;$$

$$\varepsilon_2 = \frac{1}{N} \sum_{p=0}^{P} w_p \sum_{n=p_{std}+N_p}^{p_{std}+N_{p+1}-1} e_1(n).$$

Where, $w_p$ is the weighting factor and $N_p$ is the P segment index of the starting point.

Furthermore, in order to grade the lithium-ion battery conveniently, in some example embodiments, it needs to preset the automatic grading equipment which grades the lithium-ion battery into grading levels according to the matching outcome output from the battery grading apparatus. The automatic grading equipment is connected with the battery grading apparatus. In addition, in certain example embodiments, it also needs to preset the battery grading apparatus with several grade levels and set each grade level with a threshold range.

After battery grading apparatus comparing and matching the weighted summation distances with a preset threshold range for a grading level, matching outcomes will be output to the preset automatic grading equipment to accomplish lithium-ion battery grading. Concretely, comparing and matching the preset threshold range of the grading level with a weighted summation of the linear distance, a weighted summation of the square of the linear distance and a weighted summation of the first order differential distance between the measurement curve and the standard curve. If any of the weighted summation distances is beyond the threshold range of the grading level, the lithium-ion battery will be graded to an unqualified level and matching outcomes output to the automatic grading equipment.

If the lithium-ion battery does not belong to the unqualified level, then weighting and summing the weighted summation of the linear distance, the weighted summation of the square of the linear distance and the weighted summation of the first order differential distance. Comparing and matching the weighted summations with the threshold range of each grading level one by one, until finding out the appropriate grading level, with matching outcomes output to the automatic grading equipment. For example, comparing and matching the summation outcomes with a first threshold range of a first grading level, matching the outcomes output to the automatic grading equipment if the outcomes are within the first threshold range. Otherwise, continue to compare and match the summation outcomes with a second threshold range of a second grading level, until finding out the matching grade, with matching outcomes output to the automatic grading equipment and accomplishing lithium-ion battery grading.

In accordance with the grading results of plural lithium-ion batteries, batteries of similar parameters may be grouped together to form a power battery pack. In an example embodiments, lithium-ion batteries of the same grading level may be grouped together to form a power battery pack.

The above-disclosed method for automatically grading the lithium-ion battery effectively ensures the consistency of battery parameters and increases the life cycle of a power battery pack, by virtue of its simple calculation and high precision in lithium-ion battery grading.

In certain example embodiments, the above lithium-ion battery grading by weighted summation distance can be carried out by the following algorithm:

Notations:

G: the total number of grading level thres (l): a threshold range for the grading level l $\alpha_0$: the weighting parameter for $\varepsilon_0$ $\alpha_1$: the weighting parameter for $\varepsilon_1$ $\alpha_2$: the weighting parameter for $\varepsilon_2$ if $\varepsilon_0 > \text{thres}\_0 \,||\, \varepsilon_0 < -\text{thres}\_0 \,||\, \varepsilon_1 > \text{thres}\_1 \,||\, \varepsilon_2 > \text{thres}\_2 \,||\, \varepsilon_2 < -\text{thres}\_2$ grading the cell to an unqualified level else $$\varepsilon = \alpha_0 \varepsilon_0 + \alpha_1 \varepsilon_1 + \alpha_2 \varepsilon_2$$

for g=1:G

```
            if thres(g - 1) ≤ ε < thres(g)
                grading the cell to g level;
                break;
            end
        end
end
```

Where, G is the total number of grading level in actual production and g is the serial number for the grading level which the lithium-ion battery belongs.

It should be understood, the embodiment of algorithms in above steps is to explain the technical proposal of this invention, but not restrict to the invention. Any algorithms to reach above outcomes should also be protected within the invention.

Figure 3:
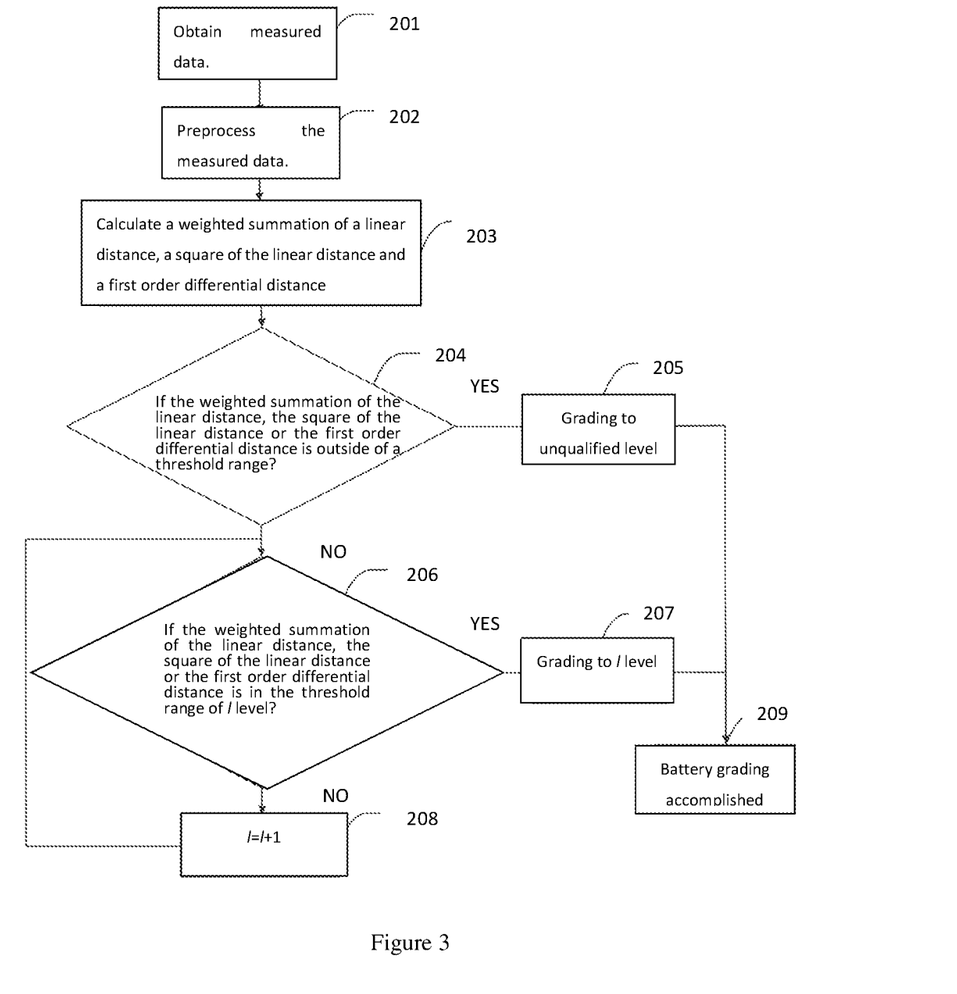
FIG. 3 shows a non-limiting, exemplary flowchart of an example method for automatically grading a lithium-ion battery.

Preferably, for a better understanding of this invention, a specific flowchart for lithium-ion battery grading is provided. FIG. 3 shows a non-limiting, exemplary flowchart of an example method for automatically grading a lithium-ion battery. The method for battery grading comprises:

Step 201: obtaining measured current and/or voltage data by a Battery grading apparatus.

Step 202: preprocessing the measured current and/or voltage data.

Step 203: calculating a weighted summation of the linear distance, a weighted summation of the square of the linear distance and a weighted summation of the first order differential distance between the measurement curve and a standard curve.

Step 204: determining whether the weighted summation distances of the linear distance, the square of the linear distance and/or the first order differential distance are outside of the preset threshold range of the grading level. If so, executing Step 205. Otherwise, executing Step 206.

Step 205: being graded to an unqualified level and executing Step 209.

Step 206: weighting and summing the weighted summation distances of the linear distance, the square of the linear distance and the first order differential distance. Comparing if these summation distances are within the threshold range of the grading level l. If so, execute Step 207. Otherwise, executing Step 208.

Step 207: Being graded to l level and execute Step 209.
Step 208: l=l+1. Repeating Step 206.
Step 209: Automatic grading equipment accomplishes battery grading.

Furthermore, in order to explain the technical scheme sufficiently, some example embodiments provide specific experiment data to prove the effect. For example, grading and formation 1200 pcs of battery samples which with the same specification of lithium-ion battery cell. Using negative formation needle bed and 5V-300 A power cabinet as grading and formation equipment. The grading test is discharged under 60 A constant current within the required time to measure voltage curve for discharging under constant current. Applying the method for automatically grading a lithium-ion battery in this example embodiment to grade lithium-ion battery samples. Set G=6, dividing to 6 grades, and set unqualified level value to be ±2% of weighted distance between the measurement curve and standard curve. Dividing the measurement curve to 1 section of segment, P=1, then all weight is 1. Concretely, below Tab 1 is the performance statistics of the grading results in this experiment

TABLE 1

|                  | Level 1 | Level 2 | Level 3 | Level 4 | Level 5 |
|------------------|---------|---------|---------|---------|---------|
| Maximum Distance | 1.3E−3  | 5.8E−3  | 5.3E−3  | 5.6E−3  | 2.1E−3  |
| Average Distance | 2.3E−4  | 2.8E−3  | 2.6E−3  | 2.5E−3  | 4.6E−4  |

Thus, it can be seen that the method for automatically grading a lithium-ion battery in this embodiment can fulfill to a higher precision grading. Meanwhile, the curve differences of the same battery grade all fall into the grade level (the threshold level distance as ±8E−3), which ensures the consistency of battery parameters and increases the cyclic life for a power battery pack.

It should be understood, the embodiment reference of the setting parameters here is to explain this invention, but not restrict to the invention.

Figure 4:
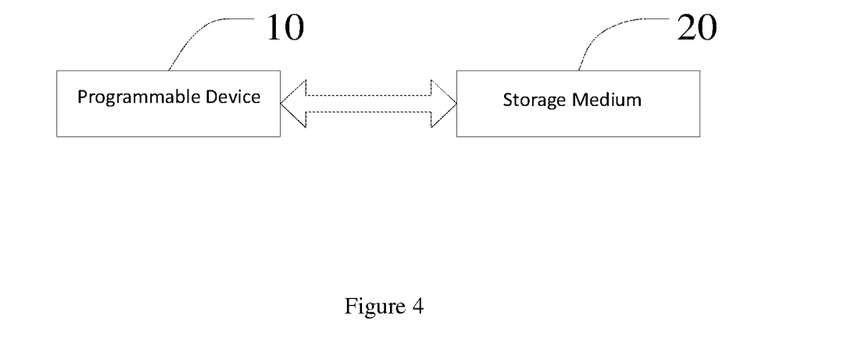
FIG. 4 shows a non-limiting, exemplary block diagram of an example battery grading apparatus.

Some example embodiments are directed to a battery grading apparatus. FIG. 4 shows a non-limiting, exemplary block diagram of an example battery grading apparatus. As shown in FIG. 4, the example battery grading apparatus comprises a Programmable Device 10 and a Storage medium 20 which connects to the Programmable Device 10.

In some example embodiments, the battery grading apparatus may comprise a data storage and a processing system including one or more processors, including one or more general purpose processors and/or one or more special purpose processors (i.e., DSPs, GPUs, FPs or ASICs). The processing system may be capable of executing application program instructions (e.g., compiled or non-compiled program and/or machine code) stored in the data storage to perform the various functions and processes described herein. The data storage may comprise one or more volatile and/or non-volatile storage components, such as, a hard disk, a magnetic disk, an optical disk, read only memory (ROM) and/or random access memory (RAM), and may include removable and/or non-removable components. The date storage may be integrated in whole or in part with the processing system. The data storage may include non-transitory computer-readable medium having stored thereon program instructions.

As shown in FIG. 4, the Programmable Device 10 is used to call program instructions in Storage medium 20 to execute methods in embodiments, for instance, executing following steps:

Step S100: preprocessing a cell of the lithium-ion battery with formation and grading, obtaining measured current and/or voltage data of charging/discharging during the process of formation and grading, and preprocessing the obtained current and/or voltage data.

Step S200: plotting the preprocessed data into a measurement curve, matching it with a stored standard reference curve for charging and discharging, and calculating a linear distance, a square of the linear distance and a first order differential distance between the measurement curve and the standard reference curve.

Step S300: calculating a weighted distance and a weighted summation distance for the calculated linear distance, the square of the linear distance and the first order differential distance, comparing and matching the weighted summation distances with a preset threshold range for each grading level, and outputting a matching outcome.

In accordance with the matching outcome of the lithium-ion battery, the battery may be categorized into a specific grading level. Based on the grading results of plural batteries, batteries of similar parameters and performance may be grouped together to form a power battery pack. In an example embodiments, lithium-ion batteries categorized into the same grading level may be grouped together to form a power battery pack.

The programmable device comprises any hardware that controls relative actions by above computer program instructions, such as processor, controller and various chip devices, which carries out the technical scheme of this invention by combining software with hardware.

Some example embodiments are directed to a non-transitory computer-readable storage medium, having computer-executable instructions embodied thereon. Upon executed by one or more processors of an electronic device, the computer-executable instructions cause the one or more processors to execute any above-described methods.

In summary, certain example embodiments are directed to a method, a non-transitory storage medium and a battery grading apparatus for automatically grading a lithium-ion battery. The method comprises following steps: Firstly, preprocessing a cell of the lithium-ion battery with formation and grading, obtaining measured current and/or voltage data of charging/discharging during the process of formation and grading, and preprocessing the obtained current and/or voltage data; Secondly, plotting the preprocessed data into a measurement curve, matching it with a stored standard reference curve for charging and discharging, and calculating a linear distance, a square of the linear distance and a first order differential distance between the measurement curve and the standard reference curve. Finally, calculating a weighted distance and a weighted summation distance for each of the calculated linear distance, the square of the linear distance and the first order differential distance. Comparing and matching the weighted summation distances with a preset threshold range for each grading level and outputting a matching outcome. The above-disclosed method for automatically grading the lithium-ion battery effectively ensures the consistency of battery parameters and increases the cyclic life of a power battery pack, by virtue of its simple calculation and high precision in lithium-ion battery grading.

It should be understood, the application of this invention is not restricted to illustrations mentioned above. Technicians in this area can improve or change above instructions, while all the improvement and change should also be protected within the invention claims attached.

What is claimed is:

1. A method for automatically grading a lithium-ion battery by a battery grading apparatus, comprising:
   Step A: preprocessing a cell of the lithium-ion battery with formation and grading, obtaining a measured current and/or voltage data of charging/discharging during the process of formation and grading, and preprocessing the obtained current and/or voltage data;
   Step B: plotting the preprocessed current and/or voltage data into a measurement curve, matching the measurement curve with a stored standard reference curve for charging and discharging, and calculating a linear distance, a square of the linear distance and a first order differential distance between the measurement curve and the standard reference curve; and
   Step C: calculating weighted distances and weighted summation distances for the calculated linear distance, the square of the linear distance and the first order differential distance respectively, comparing and matching the weighted summation distances with a preset corresponding threshold range for each of a plurality of preset grading levels, and outputting a matching outcome resulting from matching the weighted summation distances with the preset corresponding threshold range for respective preset grading level,
   wherein the Step C comprises following steps:
      Step C1: estimating a start point of the measurement curve relevant to the standard reference curve;
      Step C2: dividing the measurement curve into several segments, weighting each segment with a unique weighting factor, and calculating the weighted summation of the linear distance, the weighted summation of the square of the linear distance and the weighted summation of the first order differential distance;
      Step C3: comparing and matching the weighted summation distances with the preset threshold range of one of the plurality of preset grading levels and outputting the matching outcome to automatic grading equipment; and
      Step C4: receiving the matching outcome from the battery grading apparatus and grading the lithium-ion battery into at least one grading level by the automatic grading equipment to accomplish lithium-ion battery grading.

2. The method according to claim 1, wherein Step A further comprises smoothing, filtering and interpolating of the measured current and/or voltage data.

3. A method for automatically grading a lithium-ion battery by a battery grading apparatus, comprising:
   Step A: preprocessing a cell of the lithium-ion battery with formation and grading, obtaining a measured current and/or voltage data of charging/discharging during the process of formation and grading, and preprocessing the obtained current and/or voltage data;
   Step B: plotting the preprocessed current and/or voltage data into a measurement curve, matching the measurement curve with a stored standard reference curve for charging and discharging, and calculating a linear distance, a square of the linear distance and a first order differential distance between the measurement curve and the standard reference curve; and
   Step C: calculating weighted distances and weighted summation distances for the calculated linear distance, the square of the linear distance and the first order differential distance respectively, comparing and matching the weighted summation distances with a preset corresponding threshold range for each of a plurality of preset grading levels, and outputting a matching outcome resulting from matching the weighted summation distances with the preset corresponding threshold range for respective preset grading level,
   wherein Step A further comprises smoothing, filtering and interpolating of the measured current and/or voltage data,
   wherein the smoothing, filtering and interpolating of the measured current and/or voltage data comprise:
      performing a fast Fourier transform (FFT) operation on the measured current and/or voltage data in a time domain to produce data in a frequency domain;
      adding a window for smoothing and filtering the produced data in the frequency domain to produce filtered data in the frequency domain;
      interpolating the filtered data in the frequency domain by padding zeros to the filtered data to produce interpolated data in the frequency domain; and converting the interpolated data in the frequency domain to data in a time domain with an inverse Fast Fourier Transform.

4. The method according to claim 1, further comprising following step before the Step A:
   Step S: pre-storing the standard reference curve into the battery grading apparatus, to be matched with the measurement curve.

5. The method according to claim 1, wherein the Step B comprises:
   Step B1: obtaining the measured current and/or voltage data after preprocessing, and calling a curve plotting program to plot the obtained data into the measurement curve;
   Step B2: calling out the pre-stored standard reference curve, and then comparing and analyzing the stored standard reference curve with the measurement curves; and
   Step B3: calculating the linear distance, the square of the linear distance and the first order differential distance between the measurement curve and the standard reference curve.

6. The method according to claim 1, further comprising following step before the Step C:
   Step C0: presetting the automatic grading equipment which grades the lithium-ion battery into grading levels according to the matching outcome output from the battery grading apparatus, the automatic grading equipment being connected with the battery grading apparatus.

7. The method according to claim 1, wherein the Step C3 comprises following steps:
   Step C31: presetting the battery grading apparatus with the plurality of grading levels and setting the corresponding threshold range for each of the plurality of preset grading levels;
   Step C32: comparing and matching the corresponding threshold range for one of the preset plurality of grading levels with the weighted summation distance of the linear distance, the weighted summation of the square of the linear distance and the weighted summation of the first order differential distance, wherein if any of the weighted summation distances is outside of the corresponding threshold range of one of the plurality of preset grading levels, the lithium-ion battery will be graded to an unqualified level and the matching outcome indicating the unqualified level is output to the automatic grading equipment; and
   Step C33: in response to a determination that the lithium-ion battery does not belong to the unqualified level, weighting and summing the weighted summation distance of the linear distance, the weighted summation distance of the square of the linear distance and the weighted summation distance of the first order differential distance respectively, comparing and matching the weighted summation distances with the corresponding threshold range of each of the plurality of preset grading level one by one, until finding out an appropriate grading level, and outputting the matching outcome indicating the appropriate grading level to the automatic grading equipment.

8. A non-transitory computer-readable storage medium, having computer-executable instructions embodied thereon, wherein, upon executed by one or more processors of an electronic device, the computer-executable instructions cause the one or more processors to:
   preprocess a cell of the lithium-ion battery with formation and grading, obtain a measured current and/or voltage data of charging/discharging during the process of formation and grading, and preprocessing the obtained current and/or voltage data;
   plot the preprocessed current and/or voltage data into a measurement curve, match the measurement curve with a stored standard reference curve for charging and discharging, and calculate for a linear distance, a square of the linear distance and a first order differential distance between the measurement curve and the standard reference curve; and
   calculate weighted distances and weighted summation distances for the calculated linear distance, the square of the linear distance and the first order differential distance respectively, compare and match the weighted summation distances with a preset corresponding threshold range for each of a plurality of preset grading levels, and output a matching outcome resulting from matching the weighted summation distances with the preset corresponding threshold range for respective preset grading level,
   wherein the calculating weighted distances and weighted summation distances for the calculated linear distance, the square of the linear distance and the first order differential distance respectively, comparing and matching the weighted summation distances with the preset corresponding threshold range for each of the plurality of preset grading levels, and outputting the matching outcome comprise:
   Step C1: estimating a start point of the measurement curve relevant to the standard reference curve;
   Step C2: dividing the measurement curve into several segments, weighting each segment with a unique weighting factor, and calculating the weighted summation of the linear distance, the weighted summation of the square of the linear distance and the weighted summation of the first order differential distance;
   Step C3: comparing and matching the weighted summation distances with the preset threshold range of one of the plurality of preset grading levels and outputting the matching outcome to automatic grading equipment; and
   Step C4: receiving the matching outcome from the battery grading apparatus and grading the lithium-ion battery into at least one grading level by the automatic grading equipment to accomplish lithium-ion battery grading.

9. A battery grading apparatus comprising a memory and a processing system including at least one processor, the processing system being configured to:
   preprocess a cell of the lithium-ion battery with formation and grading, obtain a measured current and/or voltage data of charging/discharging during the process of formation and grading, and preprocessing the obtained current and/or voltage data;
   plot the preprocessed current and/or voltage data into a measurement curve, match it with a stored standard reference curve for charging and discharging, and calculate for a linear distance, a square of the linear distance and a first order differential distance between the measurement curve and the standard reference curve; and
   calculate weighted distances and weighted summation distances for the calculated linear distance, the square of the linear distance and the first order differential distance respectively, compare and match the weighted summation distances with a preset corresponding threshold range for each of a plurality of preset grading levels, and output a matching outcome resulting from matching the weighted summation distances with the preset corresponding threshold range for respective preset grading level, wherein the calculating weighted distances and weighted summation distances for the calculated linear distance, the square of the linear distance and the first order differential distance respectively, comparing and matching the weighted summation distances with the preset corresponding threshold range for each of the plurality of preset grading levels, and outputting the matching outcome comprise:

Step C1: estimating a start point of the measurement curve relevant to the standard reference curve;

Step C2: dividing the measurement curve into several segments, weighting each segment with a unique weighting factor, and calculating the weighted summation of the linear distance, the weighted summation of the square of the linear distance and the weighted summation of the first order differential distance;

Step C3: comparing and matching the weighted summation distances with the preset threshold range of one of the plurality of preset grading levels and outputting the matching outcome to automatic grading equipment; and Step C4: receiving the matching outcome from the battery grading apparatus and grading the lithium-ion battery into at least one grading level by the automatic grading equipment to accomplish lithium-ion battery grading.

\* \* \* \* \*